United States Patent [19]
Tauber et al.

[11] Patent Number: 6,011,982
[45] Date of Patent: Jan. 4, 2000

[54] HIGH CRITICAL TEMPERATURE SUPERCONDUCTOR ANTENNA COMPRISING $LA_{3-z}ME_zBA_3CA_{1-v}NC_vCU_7O_{16+x}$ WHERE ME = A RARE EARTH OR ALKALINE METAL AND NC IS A MG, CD ION

[75] Inventors: Arthur Tauber, Elberon, N.J.; Steven C. Tidrow, Silver Spring, Md.

[73] Assignee: The United States of America as represented by the Secretary of the Army, Washington, D.C.

[21] Appl. No.: 09/363,492

[22] Filed: Jul. 29, 1999

Related U.S. Application Data

[62] Division of application No. 08/979,412, Nov. 26, 1997.

[51] Int. Cl.$^7$ .................................................. H01L 39/12
[52] U.S. Cl. ........................................... 505/201; 505/238
[58] Field of Search ..................... 505/125, 126, 505/201, 238

[56] References Cited

PUBLICATIONS

Zhang et al "Supression of Superconductivity in $CaLaBaCu_3Oy$..." Wulic Xuebao 44(5) 1279–85, Abstract Only, 1995.

Kao et al "Superconductivity in the $R3CaBa3Cu7Oy$..." Mates. Res. Soc. Symp. Proc. 275, pp. 347–351, Abstract Only, 1992.

A.W. Sleight and R. Ward, *Inorganic Chemistry*, 3rd edition, p. 292 (1964); No month.

S. Engelsberg, 176 *Physica C* 451, 1991; No month.

H. Fujishita et al, 28 *Japanese Journal of Applied Physics* 754 (1989); No month.

H.C. Kao et al, 9 *Superconductor Science Technology* 10 (1996); No month.

M. Nicolas et al, 249 *Physica C* 377 (1995); No month.

C.M. Wang et al, 39 *Journal of Chinese Chemical Society* 67 (1992); and.

D.S. Wu et al, 212 *Physica C* 32 (1996). No month.

*Primary Examiner*—Mark Kopec
*Attorney, Agent, or Firm*—Michael Zelenka; George B. Tereschuk

[57] ABSTRACT

Compounds of the of the general formula $La_{3-z}Me_zBa_3Ca_{1-v}Nc_vCu_7O_{16+x}$, wherein Me can be a rare earth metal or an alkaline metal ion selected from the group consisting of yttrium (Y), ytterbium (Yb), sodium (Na) and Nc can be a 2+ion selected from the group consisting of magnesium (Mg) and cadmium (Cd) have been prepared as the HTSC in thin film superconductors. These compounds can be used as thin film high critical superconductors in thin film high critical temperature superconducting structures and antennas and in multilayered structures and devices such as Josephson junctions, broadband impedance transformers and both flux flow and field effect transistors

7 Claims, 1 Drawing Sheet

HIGH CRITICAL TEMPERATURE SUPERCONDUCTOR ANTENNA COMPRISING $LA_{3-z}ME_zBA_3CA_{1-v}NC_vCU_7O_{16+x}$ WHERE ME = A RARE EARTH OR ALKALINE METAL AND NC IS A MG, CD ION

DIVISIONAL APPLICATION

This application is a divisional application of U.S. patent application Ser. No. 08/979,412, with the same title and designated as Attorney Docket No. CECOM 5226, which was filed on Nov. 26, 1997 by the inventors herein, and in which the Examiner has issued a Notice of Allowance. This divisional application is being filed under 35 USC § 120 and 37 CFR § 1.53, and priority from that application is hereby claimed.

GOVERNMENT INTEREST

The invention described herein may be manufactured, used, and licensed by or for the Government for governmental purposes without the payment to us of any royalties thereon.

FIELD OF INVENTION

The invention relates in general to several new and useful in High Critical Temperature Superconducting (HTSC) compounds of the general formula $La_{3-z}Me_zBa_3Ca_{1-v}Nc_vCu_7O_{16+x}$ for use as HTSC's in HTSC devices, and more particularly to compounds of that general formula where Me is a rare earth or alkaline metal ion and Nc is a 2+ion selected from the group consisting of magnesium (Mg) and cadmium (Cd).

BACKGROUND OF THE INVENTION

Heretofore, a most useful HTSC in thin film superconductor technology has been$YBa_2Cu_3O_{6+x}$ (YBCO). However, there have been problems with the use of YBCO, including the fact that it undergoes a phase transition leading to twinning and stress. A more significant shortcoming with YBCO is the loss of oxygen when heated, which causes a difficult problem in the fabrication of multilayered devices. While it has been well-known that all HTSC cuprate materials lose oxygen upon heating, typically in the range around 450° to 500° C., up until now there has been no effective or practical superconductor material that retains oxygen when heated above about 500° C. This oxygen loss is significant because superconducting properties, critical currently transition temperatures ($T_c$) depend upon oxygen stoichiometry. The compounds of the general formula $La_{3-z}Me_zBa_3Ca_{1-v}Nc_vCu_7O_{16+x}$, where Me is a rare earth or alkaline metal ion and Nc is a 2+ion selected from the group consisting of magnesium (Mg) and cadmium (Cd) overcome the shortcomings, drawbacks and limitations of other cuprate HTSC materials by being significantly more stable regarding oxygen loss, particularly in the temperature ranges at which thin film multilayered structures are fabricated. Typically for growth of multilyered structures, temperatures in the range about 550° to 750° C. are required for epitaxial growth of the dielectric and a temperature range of about 650° to 800° C. is required for the HTSC (YBCO).

The HTSC system $La_{3-z}Me_zBa_3Ca_{1-v}Nc_vCu_7O_{16+x}$ of the present invention is not only attractive for numerous device applications because of its superior oxygen stability as compared with YBCO, further such compounds do not undergo phase transition between the sintering and room temperatures. Additionally, thermal cycling in $La_{3-z}Me_zBa_3Ca_{1-v}Nc_vCu_7O_{16+x}$ compounds has demonstrated reversible oxygen losses of less than 1% when heated up to 1000° C. in bulk samples, according to M. Nicolas et. al, which should permit easier preparation of multilayered structures and multilayered devices such as Josephson junctions, broadband impedance transformers and both flux flow and field effect transistors. The inventors herein have prepared thin films with compounds of the general formula $La_{3-z}Me_zBa_3Ca_{1-v}Nc_vCu_7O_{16+x}$, where Me is a rare earth or alkaline metal ion and Nc is a 2+ion selected from the group consisting of magnesium (Mg) and cadmium (Cd), with substitutions for lanthanum (La) and calcium (Ca) and have been able to increase $T_c$. The compounds of the present invention solve the oxygen loss problem of cuprate HTSC materials without suffering from any of the disadvantages, drawbacks and limitations of prior art compounds.

A superconducting bulk compound in the system $La_{3-z}Me_zBa_3Ca_{1-v}Nc_vCu_7O_{16+x}$ where z=0 and v=0, namely $La_3Ba_3CaCu_7O_{16+x}$,known as La3317, was first prepared by Engelsbereg and the material was found to be a superconductor with a $T_c$=80.2K and to have a triple perovskite structure. The compound was tetragonal with c=3a (c=11.61, a=3.87). An earlier study by H. Fujishita et. al performed on a composition close to La3317 deduced that most of the calcium atoms occupy the central position of the unit cell occupied by the yttrium atoms in $YBa_2Cu_3O_{6+x}$ (YBCO). Recently, Kao et. al reported that about half of the calcium atoms enter the yttrium sites and that the remainder are on barium (Ba) sites. Similar results have been achieved in studies of other La—Ba—Ca—Cu oxides by Fujishita and Wang, where much of the lanthanum is found in the barium sites. Engelsberg already studied the substitution of magnesium (Mg) and scandium (Sc) for calcium and he found a slight increase in lattice parameter when magnesium is substituted, c=11.71 Å and a=3.91 Å, and he observed superconductivity below 30K. Additionally, scandium substitution led to a multiphase material with no observed superconductivity. Wu et. al also investigated rare earth substitution for lanthanum in bulk samples. Based on these superconductor studies, the prior art only indicates a search for higher $T_C$ materials, while still not satisfactorily resolving the long-felt shortcomings and disadvantages of cuprate HTSC materials' oxygen loss and phase transition problems. The compounds of the present invention now resolve those problems by being more stable with respect to oxygen such that these compounds can provide more effective, practical, cheaper and longer lasting superconductors.

Prior art describing similar compounds is found at A. W. Sleight and R. Ward, *Inorganic Chemistry*, 3rd edition, p. 292 (1964);

S. Engelsberg, 176 *Physica C* 451, 1991;

H. Fujishita et. al, 28 *Journal of Applied Physics* 754 (1989);

H. C. Kao et. al, 9 *Superconductor Science Technology* 1 (1996);

M. Nicolas et. al, 249 *Physica C* 377 (1995);

C. M. Yang et. al, 39 *Journal of Chinese Chemical Society* 67 (1992); and

D. S. Wu et. al, 212 *Physica C* 32 (1996).

SUMMARY OF THE INVENTION

The general object of this invention is to provide $La_{3-z}Me_zBa_3Ca_{1-v}Nc_vCu_7O_{16+x}$ superconductors that are more stable with respect to oxygen and hence overcome the shortcomings of YBCO. A more particular object of the invention is to provide new HTSC materials with a higher level of oxygen loss stability as compared to YBCO and further does not undergo a phase transition that leads to twinning and stress. A further object of this invention is to provide compounds for thin films having lanthanum and calcium substitutes which possess none of the disadvantages of utilizing YBCO compounds.

It has now been found that the aforementioned objects can be attained using a compound of the general formula $La_{3-z}Me_zBa_3Ca_{1-y}Nc_yCu_7O_{16+x}$ as the HTSC in thin film superconductor technology. In the above formula, Me can be a rare earth metal or an alkaline metal ion selected from the group consisting of yttrium (Y), ytterbium (Yb), sodium (Na) and Nc can be a 2+ion selected from the group consisting of magnesium (Mg) and cadmium (Cd). These compounds can be used as thin film high critical superconductors in thin film high critical temperature superconducting structures and multilayered structures and devices such as Josephson junctions, broadband impedance transformers and both flux flow and field effect transistors without any of the shortcomings, disadvantages and limitations attributed to oxygen loss in YBCO.

BRIEF DESCRIPTION OF THE DRAWINGS

Other features and details of the present invention will become apparent in light of the Detailed Description of the Preferred Embodiment of the Invention and the accompanying FIG. 1 chart indicating the desorption of oxygen from thin films of the compounds of the present invention and Table I which summarizes useful properties of the thin films of the compounds of the present invention.

DESCRIPTION OF THE PREFERRED EMBODIMENT

Figure 1:
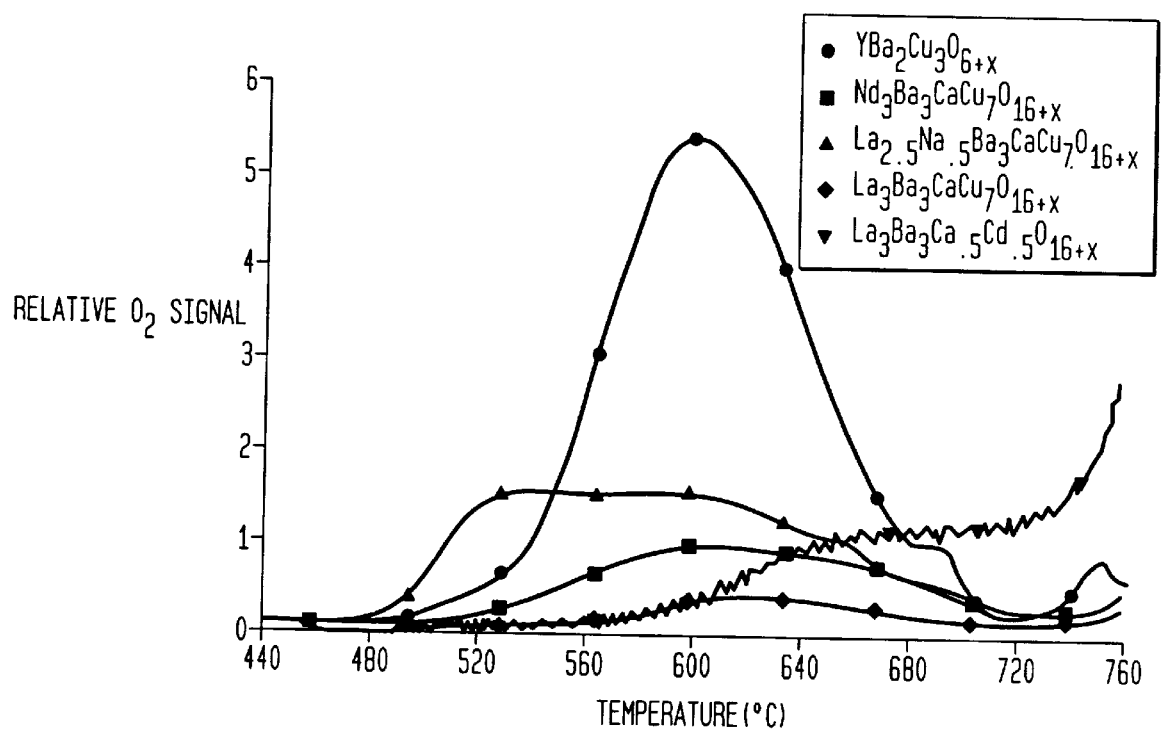

The following compounds in the series $La_{3-z}Me_zBa_3Ca_{1-y}Nc_yCu_7O_{16+x}$ have been synthesized for use as thin film superconductors in thin film high critical temperature superconductor devices: $La_2YBa_3CaCu_7O_{16+x}$, $LaY_2Ba_3CaCu_7O_{16+x}$, $La_2YbBa_3CaCu_7O_{16+x}$ and $La_{2.5}Na_{0.5}Ba_3CaCu_7O_{16+x}$. The properties of these compounds are set forth in Table I.

Bulk samples and targets in the system of the general formula $La_{3-z}Me_zBa_3Ca_{1-y}Nc_yCu_7O_{16+x}$ where Me can be a rare earth metal or an alkaline metal ion selected from the group consisting of yttrium (Y), ytterbium (Yb) and sodium (Na) and Nc can be a 2+ion selected from the group consisting of magnesium (Mg) and cadmium (Cd) were prepared in bulk form for use as targets for pulsed laser deposition (PLD) by mixing precursor powders of $La_2O_3$, $Nd_2O_3$, $Yb_2O_3$, $Y_2O_3$, $Na_2CO_3$, MgO and $CdCO_3$ in a BC mortar until they were homogeneous. The powder was pressed into 20.54 cm disks and heated in air at 3° C./minute to 975° C., held for 10 hours, then cooled at 3° C./minute and removed from the furnace. Subsequently, each disk was reground to a powder of 100 μm or less, pressed into 20.54 cm diameter disks and repressed isostatically at 344 MPa. Then the disks were heated at 3° C./minute to 1000° C. and held for 24 hours in flowing oxygen gas. Lattice parameters were obtained from powder diffractometer scans taken between 15–155° 2θ using CuKα radiation, where λ=10.54056Å. Lattice parameters are shown in Table I.

Thin films prepared by PLD in this manner averaged a thickness of 300 nm. In this connection, the term "thin film" means a body of material that can be of any size with a thickness of between 3.8 Å and 100 μm, which may also be polycrystalline, epitaxial or single crystal and may be grown using any of the numerous known deposition techniques including physical vapor deposition, liquid phase epitaxy, sol gel process, silk screening and so on. The observed reflections from thin films obtained by θ to 2θ x-ray scans are also reported in Table I. Deposition parameters were as follows: a KrF excimer laser (λ=248 nm) was used at a pulse repetition rate of 10 Hz and a laser fluence of 1–2 J/cm² at the target. The chamber was maintained at an oxygen pressure of 13.6 Pa and the heater block holding the substrates was held at 850° C., with deposition times of about 10 minutes. Samples were cooled rapidly to 650° C. for 2 minutes and then to 400° C. in 5.17 kP of oxygen for 30 minutes. The substrates employed were single crystal (211) GGG, (100) $LaAlO_3$ and (100) LSAT, which is a solid solution of 30 mole % $LaAlO_3$ and 70 mole % $Sr_2AlTaO_6$. The superconducting transition temperature and transition width were measured using an ac Eddy current apparatus. In this connection, the term "by bulk" means dense sintered polycrystalline bodies from 1 to 1.25 inches in diameter and about 0.125 to 0.25 inches in thickness.

Desorption of oxygen from several films was investigated as a function of temperature using thermal deposition mass spectrometry, which involved detecting desorbing $O_2$ using a double focusing mass spectrometry. The spectrometer has high mass resolution which allows the oxygen signal to be separated from interfering species such as hydrocarbons of the same nominal mass, i.e. 32 AMU. For analysis, a piece of thin film coated substrate was introduced into a tantalum foil cell that had a 0.005 in. 5% Re-W/26% Re-W thermocouple spotwelded to it. The cell was attached to a vacuum feed through that allowed samples to be moved into a roughing chamber and then into a an analysis chamber that contained the mass spectrometer. The base pressure of the analysis chamber at the onset of desorption was in the mid $10^{-9}$ Torr range, which provided a low oxygen background and greater sensitivity for detecting oxygen originating from the content of the cell. The cell temperature could be ramped to 1500° C., but typically a maximum of 800° C. was used. A linear temperature ramp of 1.4K/sec. was maintained using a feedback temperature controller and a 100 amp power supply. The area of the thin film was determined by computer processing of a scanned image of the sample and sample thickness was determined by fracturing a coated substrate and measuring film cross section with scanning electron microscopy. The oxygen desorption spectra were then normalized to the calculated volume of the film for each of the samples, thus allowing direct comparison of oxygen desorption from the films.

All substitutions of either La or Ca in accordance with the present invention resulted in the preservation of a tetragonal structure. In bulk samples, changes in intensity of x-ray diffraction lines are consistent with the increase or decrease in the scattering power of the substituent. Very small changes in the c lattice parameter were also noted, consistent with the changes in ionic radii of substituent ions, while the a parameter exhibited a slight expansion. For thin films, contractions in the c parameter were observed when the substrate was $LaAlO_3$, while slight expansion was found when the LSAT or GGG substrates were used. The results of lattice expansion or contraction of the thin film are consistent with known lattice parameters for the substrates. It is noted that the following compounds in the series $La_{3-z}Me_zBa_3Ca_{1-y}Nc_yCu_7O_{16+x}$, synthesized in accordance with the present invention constitute new compositions of matter: $La_2YBa_3CaCu_7O_{16+x}$, $LaY_2Ba_3CaCu_7O_{16+x}$, $La_2YbBa_3CaCu_7O_{16+x}$, $La_{20.5}Na_{0.5}Ba_3CaCu_7O_{16+x}$ and $La_3Ba_3Ca_{0.5}Cd_{0.5}Cu_7O_{16+x}$.

All thin films prepared by PLD using the bulk targets show the same epitaxial relationship irrespective of the substrate: $La_{3-z}Me_zBa_3Ca_{1-y}Nc_yCu_7O_{16+x}$ (00 1) on (100) $LaAlO_3$, on (100) LSAT or (211) GGG, as indicated by table I, above. The strongest reflection from each of the thin films was always (006). The best quality films obtained, in terms of the presence of higher order reflections, were those deposited on $LaAlO_3$. This may be explained by the fact that of all the substrates employed, only $LaAlO_3$ placed thin films in compression. Another possible explanation is that film deposition conditions were not optimized.

All substituent compounds exhibited high $T_c$ superconductivity, although the transition temperatures were lower than those in the unsubstituted compounds. The highest transition temperatures were obtained when rare earth ions Nd, Yb or Y replaced La. Although Engelsberg found that the substitution of Mg for Ca resulted in a reduced $T_c$, the inventors herein observed a $T_c=35$ K upon replacing half of the Ca with Mg, which was close to Engleberg's results. However, the substitution of half of the Ca by Cd by the inventors herein resulted in a much higher transition temperature of 55K. While the prior art studies sought a higher $T_c$, the present inventors have discovered that oxygen stability is the key factor for multilayer technology and have proven that surprisingly satisfactory results are now possible with the use of slightly lower $T_c$ materials which are oxygen stable. The fact that divalent Cd is much larger than Mg and has an ionic radius close to Ca, appears to be a major factor influencing superconductivity. Another significant factor could also be the nature of the bonding.

All thin film compounds prepared in accordance with the present invention, when compared with YBCO, desorb significantly less oxygen, as shown in FIG. 1, when heated. Referring now to FIG. 1, the desorption of oxygen from thin films for compounds $YBa_2Cu_3O_{6+x}$ (YBCO), $Nd_2Ba_3CaCu_7O_{16+x}$, $La_{20.5}Na_{0.5}Ba_3CaCu_7O_{16+x}$, $La_3Ba_3CaCu_7O_{16+x}$, and $La_3Ba_3Ca_{0.5}Cd_{0.5}O_{16+x}$, are compared. Compounds of the present invention, specifically $Nd_3Ba_3CaCu_7O_{16+x}$, with losses of about 4%, $La_{20.5}Na_{0.5}Ba_3CaCu_7O_{16+x}$, with losses of about 8%, $La_3Ba_3CaCu_7O_{16+x}$, with losses of about 1%, and $La_3Ba_3Ca_{0.5}Cd_{0.5}O_{16+x}$ with losses of about 2%, all demonstrate significantly lower oxygen losses than the YBCO curve, which loses 17% oxygen when heated in the temperature range between 450 to 650° C. When some La is replaced by Na, curve C in FIG. 1, the largest desorption for any substituted compound was observed, while the substitution of Cd and Ca, curve E of FIG. 1, showed a smaller effect. It is theorized that the occupancy by light rare earths which have large ionic radii, in the rare earth site for this triple perovskite structure, strongly influences the retention of oxygen with heating.

In the foregoing disclosure, the term "high critical temperature thin film superconductor device" means a copper oxide superconductor having a critical temperature in excess of 30° K. Examples of HTSC with reduced sensitivity to oxygen loss are $La_{3-z}Me_zBa_3Ca_{1-y}Nc_yCu_7O_{16+x}$, with particular emphasis on those fabricated by the inventors herein and listed on Table I.

The term "single layer device" refers to a device including a single layer of high critical temperature superconductor and any combination of other materials, such as dielectric, pyroeletric, piezoelectric, or ferromagnetic materials. The term "multi-layer device" refers to a device including at least two layers of a high critical temperature superconductor, and any combination of other materials, including but not limited to materials with ferroelectric, pyroeletric, piezoelectric, dielectric or ferromagnetic layers.

High critical temperature superconducting compounds of this invention can be used in devices including flux flow transistors, current limiters, broadband impedance transformers, diodes, delay lines, resonators, antenna, antenna feeds, switches, phase shifters, mixers, amplifiers, balometers and magneto-resistors, but are not limited to those devices.

The compounds of the invention can be made in the form of a bulk single crystal, a dense polycrystalline disc, a crystalline expitaxial thin film or a polycrystalline thin film. In the manufacture of thin films, some form of laser ablation is preferred, but the compounds can also be made by techniques such as sputtering, MOCVD, MBE, evaporation, and so on. The compounds of the present invention can be used in bulk form to serve as targets for the deposition of thin films by such methods as sputtering or laser ablation. The thin films may serve as superconductors in single and multilayer structures. As single crystals the compounds of this invention can be used as bulk substrates. Melt textured materials can be used for flux trapping, magnets, energy storage devices and so on.

The following examples illustrate uses of the $La_{3-z}Me_zBa_3Ca_{1-y}Nc_yCu_7O_{16+x}$ compounds of this invention.

An antenna can be made according to the invention by depositing a single layer of high critical temperature superconductor (HTSC) directly onto a suitable single crystal substrate. The HTSC is then patterned to complete the device.

A superconductor insulator superconductor step edge Josephson junction, which is a multilayer superconducting device, is fabricated according to the invention using the superconductor and appropriate metals or dielectrics. More particularly, the device is made by depositing a single layer of HTSC on a single crystal substrate or a substrate of other composition buffered with a layer of appropriate dielectric. Next, the HTSC is patterned by ion milling at a 45° angle. A HTSC layer is then deposited. Finally, another HTSC layer is deposited and patterned to complete the device.

We wish it to be understood that we do not desire to be limited to the exact details of construction shown and described for obvious modifications will occur to a person skilled in the art.

TABLE 1

Properties of $La_{3-z}Me_zBa_3Ca_{1-y}Cu_7O_{16+x}$ Compounds.

| Compound | Lattice Parameter (Å) | | Onset $T_c$ (K) | $\Delta T_c$ (K) | Observed Reflections |
|---|---|---|---|---|---|
| | c | a | | | |
| $La_3Ba_3CaCu_7O_{16+x}$ | 11.650 | 3.865 | 72 | 4 | |
| | 11.680* | | 80* | | |
| $La_3Ba_3CaCu_7O_{16+x}$/LSAT | 11.665 | | | | 003, 005, 006, 007, 0012 |
| $La_3Ba_3CaCu_7O_{16+x}$/GGG | 11.540 | | | | 003, 005, 006, 007, 009 |

TABLE 1-continued

Properties of $La_{3-z}Me_zBa_3Ca_{1-v}Cu_7O_{16+x}$ Compounds.

| Compound | Lattice Parameter (Å) c | a | Onset $T_c$ (K) | $\Delta T_c$ (K) | Observed Reflections |
|---|---|---|---|---|---|
| $La_3Ba_3CaCu_7O_{16+x}$/$LaAlO_3$ | 11.660 | | 35 | 15 | 003, 004, 005, 006, 007, 009, 0011, 0012 |
| $La_2YBa_3CaCu_7O_{16+x}$ | 11.580 | 3.850 | 72 | 3 | |
| $LaY_2Ba_3CaCu_7O_{16+x}$ | 11.630 | 3.868 | 74 | 6 | |
| $LaY_2Ba_3CaCu_7O_{16+x}$/LSAT | 11.703 | | | | 002, 005, 006, 007 |
| $Nd_3Ba_3CaCu_7O_{16+x}$ | 11.614 | 3.874 | 42 | | |
| $Nd_3Ba_3CaCu_7O_{16+x}$/LSAT | | | 40 | 20 | |
| $La_2YbBa_3CaCu_7O_{16+x}$ | 11.530 | 3.843 | 74 | 5 | |
| $La_2YbBa_3CaCu_7O_{16+x}$/LSAT | 11.628 | | 45 | >20 | 003, 005, 006, 007, 009, 0010, 0011 |
| $La_2YbBa_3CaCu_7O_{16+x}$/$LaAlO_3$ | 11.630 | | | | 003, 005, 006, 007, 008, 009, 0010, 0011 |
| $La_2YbBa_3CaCu_7O_{16+x}$/GGG | 11.683 | | | | 003, 005, 006, 007 |
| $La_{2.5}Na_{.5}Ba_3CaCu_7O_{16+x}$ | 11.630 | 3.870 | 68 | 18 | [multiphase] |
| $La_{2.5}Na_{.5}Ba_3CaCu_7O_{16+x}$/$LaAlO_3$ | 11.662 | | 65 | >40 | 003, 005, 006, 007 |
| $La_{2.5}Na_{.5}Ba_3CaCu_7O_{16+x}$GGG | 11.664 | | | | 006, 009 |
| $La_3Ba_3Ca_{.5}Cd_{.5}Cu_7O_{16+x}$ | 11.661 | 3.881 | 55 | | |
| $La_3Ba_3Ca_{.5}Cd_{.5}Cu_7O_{16+x}$/LSAT | 11.720 | | | | 003, 006 |
| $La_3Ba_3Ca_{.5}Cd_{.5}Cu_7O_{16+x}$/$LaAlO_3$ | 11.265 | | 70 | >45 | 003, 006 |
| $La_3Ba_3Ca_{.5}Cd_{.5}Cu_7O_{16+x}$/GGG | 11.730 | | | | 003, 006, 007 |
| $La_3Ba_3Ca_{.5}Mg_{.5}Cu_7O_{16+x}$ | 11.661 | 3.890 | 35 | 15 | |
| $La_3Ba_3Ca_{.5}Mg_{.5}Cu_7O_{16+x}$/$LaAlO_3$ | 11.650 | | | | 003, 005, 006, 007, 009, 0010, 0011 |
| $La_3Ba_3Ca_{.5}Mg_{.5}Cu_7O_{16+x}$/GGG | 11.692 | | | | 003, 005, 006, 007, 0011 |

*S. Engelsberg, Physica C, 176, 451 (1991)

We claim:

1. An antenna including a single layer of a high critical temperature copper oxide superconductor, comprising:

a single layer of a thin film deposited onto a single crystal substrate;

said thin film being constructed of a superconductive compound of the general formula $La_{3-z}Me_zBa_3Ca_{1-v}Nc_vCu_7O_{16+x}$, wherein Me is selected from the group consisting of Y, Yb and Na;

said Nc is a 2+ion selected from the group consisting of Mg and Cd;

said z is about 0 to 2;

said v is about 0 to 00.5, with the proviso that at least one of said z and said v is greater than 0;

said compound having metallic behavior above the superconducting transition;

said compound retaining oxygen when heated in the range of 450° C. to 650° C.; and said single layer of a high critical temperature copper oxide superconductor being patterned to complete the device.

2. The antenna, as recited in claim 1, further comprising said single layer of a high critical temperature copper oxide superconductor being constructed of $La_2YBa_3CaCu_7O_{16+x}$.

3. The antenna, as recited in claim 1, further comprising said single layer of a high critical temperature copper oxide superconductor being constructed of $LaY_2Ba_3CaCu_7O_{16+x}$.

4. The antenna, as recited in claim 1, further comprising said single layer of high critical temperature copper oxide superconductor being constructed of $La_2YbBa_3CaCu_7O_{16+x}$.

5. The antenna, as recited in claim 1, further comprising said single layer of a high critical temperature copper oxide superconductor being constructed of $La_{20.5}Na_{0.5}Ba_3CaCu_7O_{16+x}$.

6. The antenna, as recited in claim 1, further comprising said single layer of a high critical temperature copper oxide superconductor being constructed of $La_3Ba_3Ca_{0.5}Mg_{0.5}Cu_7O_{16+x}$.

7. The antenna, as recited in claim 1, further comprising said single layer of a high critical temperature copper oxide superconductor being constructed of $La_3Ba_3Ca_{0.5}Cd_{0.5}Cu_7O_{16+x}$.

* * * * *

UNITED STATES PATENT AND TRADEMARK OFFICE
CERTIFICATE OF CORRECTION

PATENT NO. : 6,011,982
DATED : January 4, 2000
INVENTOR(S) : Arthur Tauber and Steven C. Tidrow It is certified that error appears in the above-identified patent and that said Letters Patent is hereby corrected as shown below:

Column 3,
Lines 55 and 58, change "20.54 cm" to read -- 2.54 cm --;
Line 64, change "10.54056 Å" to read -- 1.54056 Å --;

Column 5,
Lines 1, 37 and 41, change formula "$La_{20.5}Na_{0.5}Ba_3CaCu_7O_{16+x}$" to read
-- $La_{2.5}Na_{0.5}Ba_3CaCu_7O_{16+x}$ --
Line 20, change formula "$T_{c=}$ 35 K" to read -- $T_c = 35$ K --;

Column 8,
Line 43, change formula "$La_{20.5}Na_{0.5}Ba_3CaCu_7O_{16+x}$" to read
-- $La_{2.5}Na_{0.5}Ba_3CaCu_7O_{16+x}$ --.

Signed and Sealed this

Eleventh Day of March, 2003

JAMES E. ROGAN
*Director of the United States Patent and Trademark Office*